(12) United States Patent
Takabayashi

(10) Patent No.: US 7,161,750 B2
(45) Date of Patent: Jan. 9, 2007

(54) RETAINER, EXPOSURE APPARATUS, AND DEVICE FABRICATION METHOD

(75) Inventor: Yukio Takabayashi, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/005,598

(22) Filed: Dec. 6, 2004

(65) Prior Publication Data

US 2005/0078386 A1    Apr. 14, 2005

Related U.S. Application Data

(63) Continuation of application No. PCT/JP03/09533, filed on Jul. 28, 2003.

(30) Foreign Application Priority Data

Jul. 31, 2002    (JP)    ............... 2002-224082

(51) Int. Cl.
    *G02B 7/02*    (2006.01)
(52) U.S. Cl. .............. 359/819; 359/820; 359/822
(58) Field of Classification Search ............... 359/819, 359/820, 822
    See application file for complete search history.

(56) References Cited

U.S. PATENT DOCUMENTS

| 4,621,899 A | 11/1986 | Hoult et al. |
| 4,763,991 A | 8/1988 | Klotz, Jr. |
| 6,400,516 B1 | 6/2002 | Spinali |
| 6,674,584 B1 * | 1/2004 | Anderson ............ 359/819 |
| 2002/0021503 A1 * | 2/2002 | Osterried ............ 359/819 |

FOREIGN PATENT DOCUMENTS

| EP | 1 164 398 A2 | 12/2001 |
| JP | 2-304511 | 12/1990 |
| JP | 2-304511 A | 12/1990 |
| JP | 10-186196 A | 7/1998 |
| NL | 9402125 | 7/1996 |
| WO | 00/37981 | 6/2000 |

OTHER PUBLICATIONS

International Searching Authority; Japanese Patent Office; "PCT International Search Report"; corresponding to International Application No. PCT/JP03/09533; date of mailing Mar. 8, 2004; (3 pages).
Chinese Office Action for Appl. 03815534.6, dated Jun. 2, 2006 (w/ Translation).
Koren Office Action for Appl. 10-2005-7001545, dated Apr. 17, 2006 (w/ Translation).

* cited by examiner

*Primary Examiner*—Hung Xuan Dang
*Assistant Examiner*—Joseph Martinez
(74) *Attorney, Agent, or Firm*—Morgan & Finnegan,LLP

(57) ABSTRACT

A retainer for holding an optical element having three first grooves includes a first support member that supports the optical element through the first grooves, and a second support member that has three second grooves corresponding to the first grooves, and supports the first support member through the second grooves.

3 Claims, 15 Drawing Sheets

RETAINER, EXPOSURE APPARATUS, AND DEVICE FABRICATION METHOD

This is continuation of International application Ser. No. PCT/JP03/09533, filed Jul. 28, 2003 in English and is herein incorporated by reference.

This application claims a benefit of priority based on Japanese Patent Application No. 2002-224082, filed on Jul. 31, 2002, which is hereby incorporated by reference herein in its entirety as if fully set forth herein.

TECHNICAL FIELD

The present invention relates generally to precision machines for mounting an optical element, and more particularly to a projection optical system in an exposure apparatus, etc. The present invention is suitable, for example, for a retainer that holds an optical element for obtaining a more precise imaging relationship in an exposure apparatus in exposing an image on an original sheet, such as a mask (reticle) onto an object in a lithography that fabricates a semiconductor device, an image pick-up device (such as a CCD), and a thin film magnetic head.

BACKGROUND TECHNOLOGY

A reduction projection exposure apparatus has been conventionally employed which uses a projection optical system to project a circuit pattern formed on a mask (reticle) onto a wafer, etc. to transfer the circuit pattern, in manufacturing devices. The projection optical system causes interface and imaging of diffracted beams from the circuit pattern on the wafer.

The devices to be mounted on electronic apparatuses should be highly integrated to meet recent demands for miniaturization and low profile of electronic apparatuses, and finer circuit patterns to be transferred or higher resolution have been demanded increasingly. A shorter wavelength of a light source and a higher numerical aperture ("NA") in a projection optical system are effective to the high resolution as well as a reduced aberration in the projection optical system.

An optical element, such as a lens and a mirror, when deforming in a projection optical system causes aberration because an optical path refracts before and after the deformation and light that is supposed to form an image at one point does not converge on one point. The aberration causes a positional offset and short-circuits a circuit pattern on a wafer. On the other hand, a wider pattern size to prevent short-circuiting is contradictory to a fine process.

Therefore, a projection optical system with small aberration should hold its optical element(s) without changing a shape and a position relative to the optical axis of the optical element in the projection optical system so as to maximize the original optical performance of the optical element. In particular, the projection lens tends to have a larger caliber and a larger lens capacity due to the recent high NA in the projection optical system, and easily deforms by its own weight. In addition, a recently extensively developed exposure apparatus that uses extreme ultraviolet ("EUV") light ("EUV exposure apparatus") requires the projection optical system to include a small number of reflective elements or mirrors for the EUV light having such a characteristically short wavelength as about 10 to 15 nm, and precision of shapes of these mirrors and positions of these mirrors relative to the optical axis are extremely strict.

The EUV exposure apparatus is used for exposure of a circuit pattern of 0.1 μm, and has very strict critical dimension accuracy. Therefore, the mirror's surface shape is permitted to have deformation of only about 0.1 nm or less. Therefore, a processed shape of a mirror should be precisely reproduced in the EUV exposure apparatus after the mirror is assembled into the exposure apparatus.

However, the mirror is made of such a soft parent material that even a force applied by a retainer that holds the mirror or holding power would deform the mirror by about 0.1 nm. In addition, the mirror does not reflect all the exposure light, but absorbs the exposure light of 30% or greater. The absorbed exposure light would become residual heat, thermally expand the mirror, and change a shape of the mirror and its position relative to the optical axis. In other words, it has been difficult to hold a mirror in a projection optical system and maintain desired optical performance without changing a shape of the mirror or its position relative to an optical axis.

DISCLOSURE OF THE INVENTION

Accordingly, it is an exemplified object of the present invention to provide a correction member, a retainer, an exposure apparatus, a device fabrication method which may provide desired optical performance by reducing aberration that is caused by deformation and a positional offset of an optical element, which aberration otherwise deteriorates the imaging performance.

A retainer of one aspect according to the present invention for holding an optical element having three first grooves includes a first support member that supports the optical element through the first grooves, and a second support member that has three second grooves corresponding to the first grooves, and supports said first support member through the second grooves.

The first grooves may be linear grooves arranged in radial directions of the optical element. The three first grooves or extensions of the three first grooves may intersect at an approximately one point. The three second grooves or extensions of the three second grooves may intersect at an approximately one point.

The three first grooves and/or the three second grooves may have a spiral shape. Two different pairs selected from extensions of the three first and/or second grooves may intersect each other at different points. Each pair includes two extensions of first or second grooves. The one point may be a center of the optical element or a point other than a center of the optical element. The three second grooves or extensions of the three second grooves may intersect at an approximately one point. The three first grooves may be arranged at an interval of 120°, and the three second grooves are arranged at an interval of 120°. Each of the first and second grooves may have an approximately V-shaped section. The V-shaped section may form an angle of approximately 90°. The first support member may have a spherical shape. The first support member may roll along the first or second groove. The first support member contacts the optical element at a position apart by 60% to 70% of a radius of the optical element from a center of the optical element.

A retainer of another aspect according to the present invention for holding an optical element having three spherical convexes arranged around the optical element includes a holding member that has three grooves each of which has an approximately V-shaped section for mounting the spherical convexes and is arranged in a radial direction of the optical element, wherein the retainer holds the optical element via the grooves. The holding member may be movable in the radial direction of the optical element. The three spherical convexes may be arranged at an interval of 120° around a center of the optical element. The retainer may further include a drive mechanism for driving each of two support planes that form the grooves in a direction perpendicular to the support planes. The convex may have a hole having an approximately V-shaped section, and said retainer further comprises a pressurization mechanism for pressurizing the spherical convex through the hole.

A retainer of still another aspect according to the present invention for holding an optical element having three approximately V-shaped convexes around the optical element includes a holding member that has a pair of spherical parts that sandwich and contact the approximately V-shaped convexes, and holds the optical element via the spherical parts. The holding member may be movable in a radial direction of the optical element. The three approximately V-shaped convexes may be arranged at an interval of 120° around a center of the optical element. The optical element may be a mirror.

An exposure apparatus of another aspect according to the present invention includes the above retainer, and an optical system that includes an optical element held by said retainer, and exposes a pattern formed on a reticle or mask onto an object, the optical element having three first grooves. An exposure apparatus of another aspect according to the present invention includes the above retainer, and an optical system that includes an optical element held by said retainer, and exposes a pattern formed on a reticle or mask onto an object, the optical element having three spherical convexes around a peripheral of said optical element.

An exposure apparatus of another aspect according to the present invention includes the retainer, arid an optical system that includes an optical element held by said retainer, and exposes a pattern formed on a reticle or mask onto an object, the optical element having three approximately V-shaped convexes around a peripheral of the optical element.

A device fabrication method of another aspect of the present invention includes the steps of exposing a pattern on a mask, onto an object by using the above exposure apparatus, and performing a predetermined process for the exposed object. Claims for the device fabrication method that exhibits operations similar to those of the above exposure apparatus cover devices as their intermediate products and finished products. Moreover, such devices include semiconductor chips such as LSIs and VLSIs, CCDs, LCDs, magnetic sensors, thin-film magnetic heads, etc.

Other objects and further features of the present invention will become readily apparent from the following description of the embodiments with reference to accompanying drawings.

BEST MODE FOR IMPLEMENTNG THE INVENTION

Figure 1A:
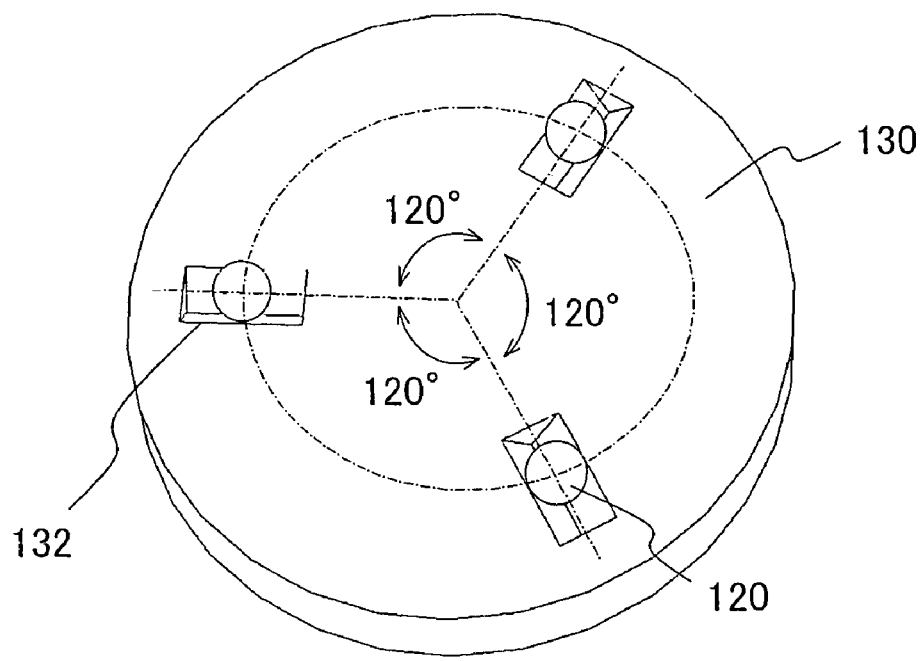
FIG. 1 is a schematic structure of a retainer of one aspect of the present invention.
Figure 1B:
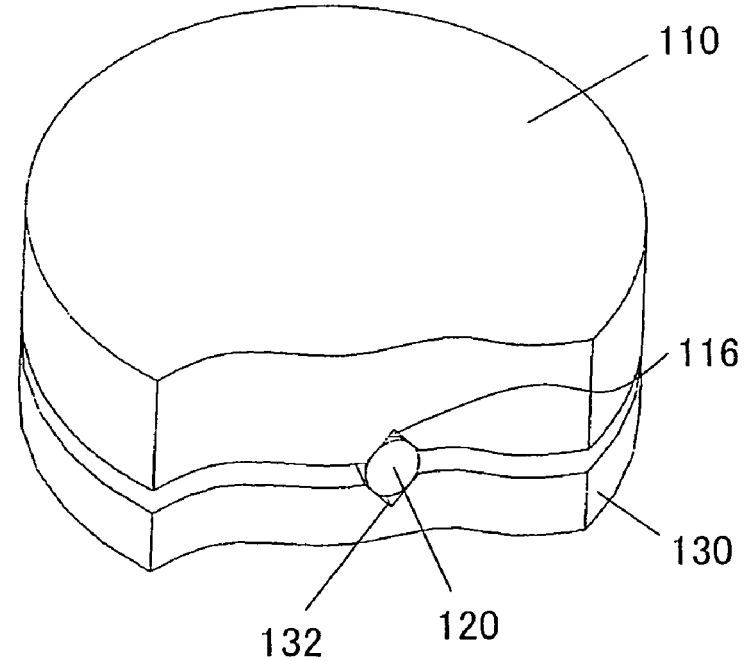

Referring now to accompanying drawings, a description will be given of an illustrative retainer and exposure apparatus of the present invention. However, the present invention is not limited to these embodiments, and each element may be replaced within a scope of this invention. For example, although the retainer 100 is applied to a projection optical system 530 in the exposure apparatus 500 in the instant embodiment, it is applicable to an illumination optical system 514 in the exposure apparatus 500 and other known optical systems. Here, FIG. 1 is a schematic structure of the retainer 100 as one aspect of the present invention, wherein FIG. 1A is a perspective view of the retainer 100, and FIG. 1B is a sectional view of the retainer 100 that holds the optical element 110.

As best shown in FIG. 1, the retainer 100 includes a support member (as a first support member) 120, and a fixing member (as a second support member) 130. The retainer 100 is applied to a projection optical system 530, and holds the optical element 110 through the support member 120 and fixing member 130.

Figure 2:
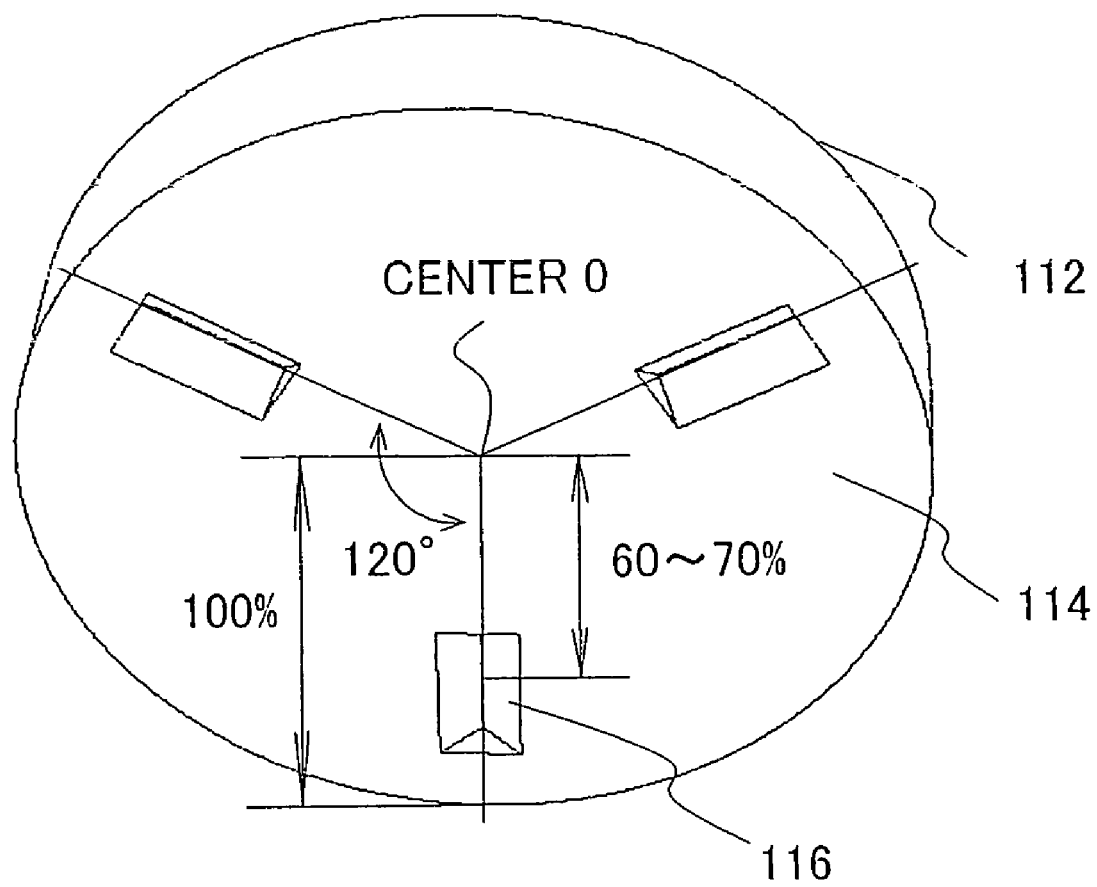
FIG. 2 is a schematic perspective view of an optical element shown in FIG. 1.

The optical element 110 is mounted on the support member 120, which will be described later, via first grooves 116, and images light using reflections, refractions, diffractions, etc. The optical element 110 includes, for example, a lens, a parallel plate glass, a prism, a mirror, and a Fresnel zone plate, a kinoform, a binary optics, a hologram, and other diffraction optical elements. The optical element 110 has, as shown in FIG. 2, three V-shaped first grooves 116 each having an approximately V-shaped section on a bottom surface 114 opposite to a reflection surface 112 or at the side of the support member 112. Here, FIG. 2 is a schematic perspective view of the optical element 110 shown in FIG. 1. The "approximately V-shaped section" or mere "V-shaped section" means to cover a substantially V-shaped section, for example, one having a round tip, as well as a perfect V-shaped section in this application.

Figure 15:
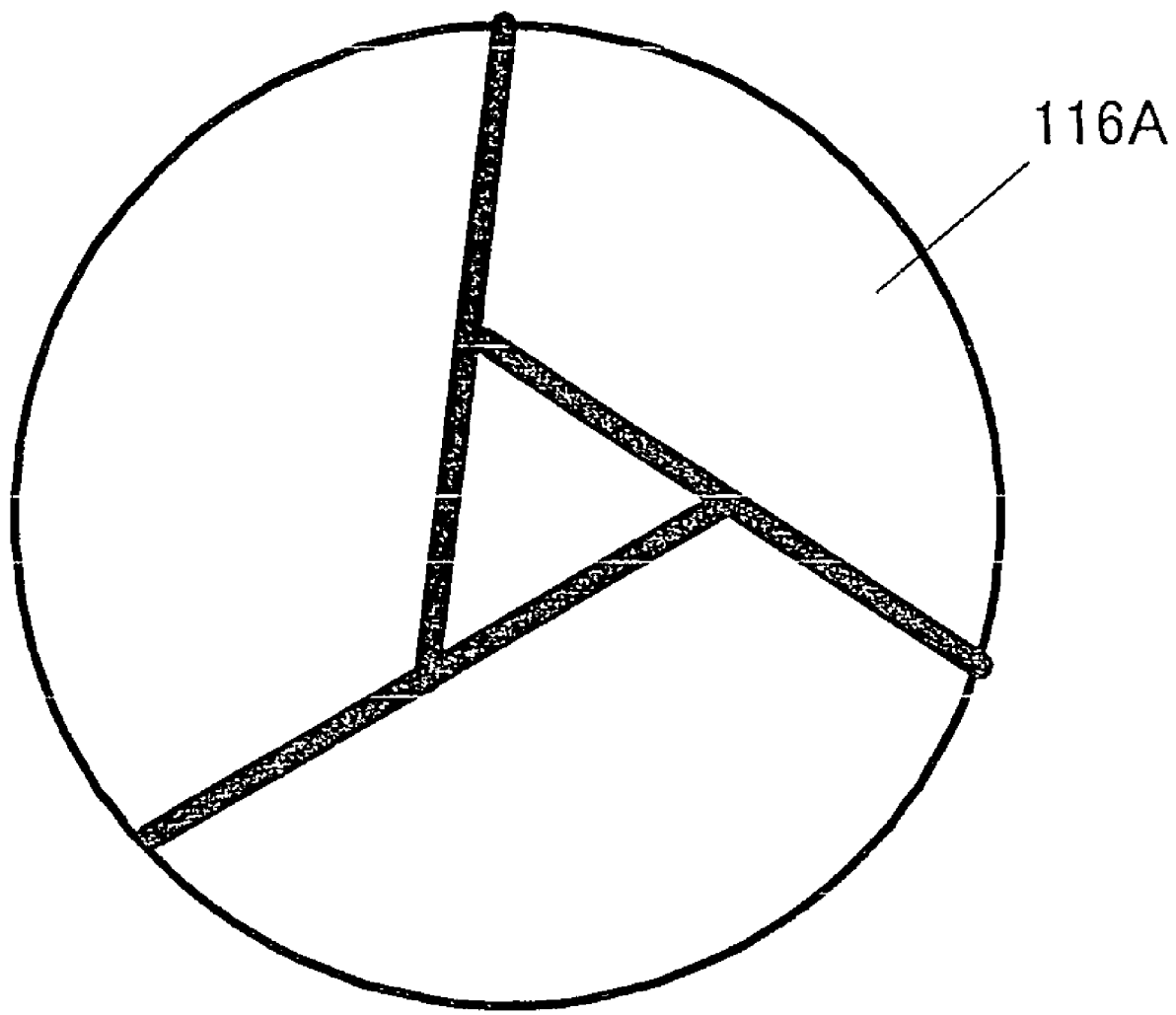
FIG. 15 is a plane view showing a variation of a shape of the first grooves shown in FIG. 1.

The first grooves extend in a radial direction of the optical element 110 and are arranged at an interval of 120° in a circumferential direction around the center O of the optical element 110 on the bottom surface 114. Of course, the first grooves 116 do not have to be linear grooves arranged in radial directions of the optical element 110. For example, the first grooves do not have to be linear grooves or may be spiral grooves arranged in a spiral direction or in spiral directions. Alternatively, the first grooves or extensions of the first grooves may form a shape as shown in FIG. 15. Here, FIG. 15 is plane view showing first grooves 116A as a variation of a shape of the first grooves 116.

The first groove 116 is mounted onto the support member 120, which will be described later, and the optical element 110 is held via the first grooves 116. Since the first grooves 116 distribute at approximately a regular interval in the circumferential direction of the optical element 110, the optical element 110 is stable on the support member 120. In order to minimize the bending due to gravity drawdown of the optical element 110, the first grooves 116 are preferably located so that the first grooves 116 of the optical element may contact the support member 120 at positions apart by about 60% to 70% from the center O of the optical element 110 in its radial direction. Therefore, the first grooves 116 are preferably formed in place apart by 50% to 80% from the center O of the optical element 110 in its radial direction. Of course, the first grooves 116 may be formed in place apart by 60% to 70% from the center O.

The support member 120 is spherical, contacts the first grooves 116, and supports the optical element 110 via the first grooves 116. The support member 120 is made of a material that has substantially the same coefficient of linear expansion as that of the optical element 110. This structure would prevent a relative displacement between the optical element 110 and support element 120 which is otherwise caused by the different coefficients of linear expansion when the temperature circumstance changes, and a disengagement between the support member 120 from the first grooves 116 or deformation of the optical element 110 due to the external force via the first grooves 116.

The fixing member 130 is located opposite to the optical element 110 with respect to the support member 120. The fixing member 130 includes three second grooves 132 each having an approximately V-shaped section on a surface at the side of the optical element 110, and fixes the support member 120 via the second grooves 132. Of course, the second grooves 132 do not have to be linear grooves arranged in radial directions of the optical element 110. For example, the second grooves do not have to be linear grooves or may be spiral grooves arranged in a spiral direction or in spiral directions.

The second grooves 132 extend in a radial direction, and are arranged at a pitch of 120° around the center O in the circumferential direction. In other words, the second grooves 132 are arranged opposite to the first grooves 116 on the bottom surface 114 of the optical element 110. The second grooves 132 mount the support member 120 so that the support member 120 may move in a radial direction or have a degree of freedom in the radial direction. The second grooves 132 restrict circumferential actions of the support member 120 and enable the spherical support member 120 to roll in the radial direction. The second grooves 132 allow a radial expansion when the temperature circumstance changes and the optical element 110 and/or the fixing member 130 thermally expand, and thus prevent a positional offset of the center O of the optical element 110 relative to the optical axis.

Figure 3:
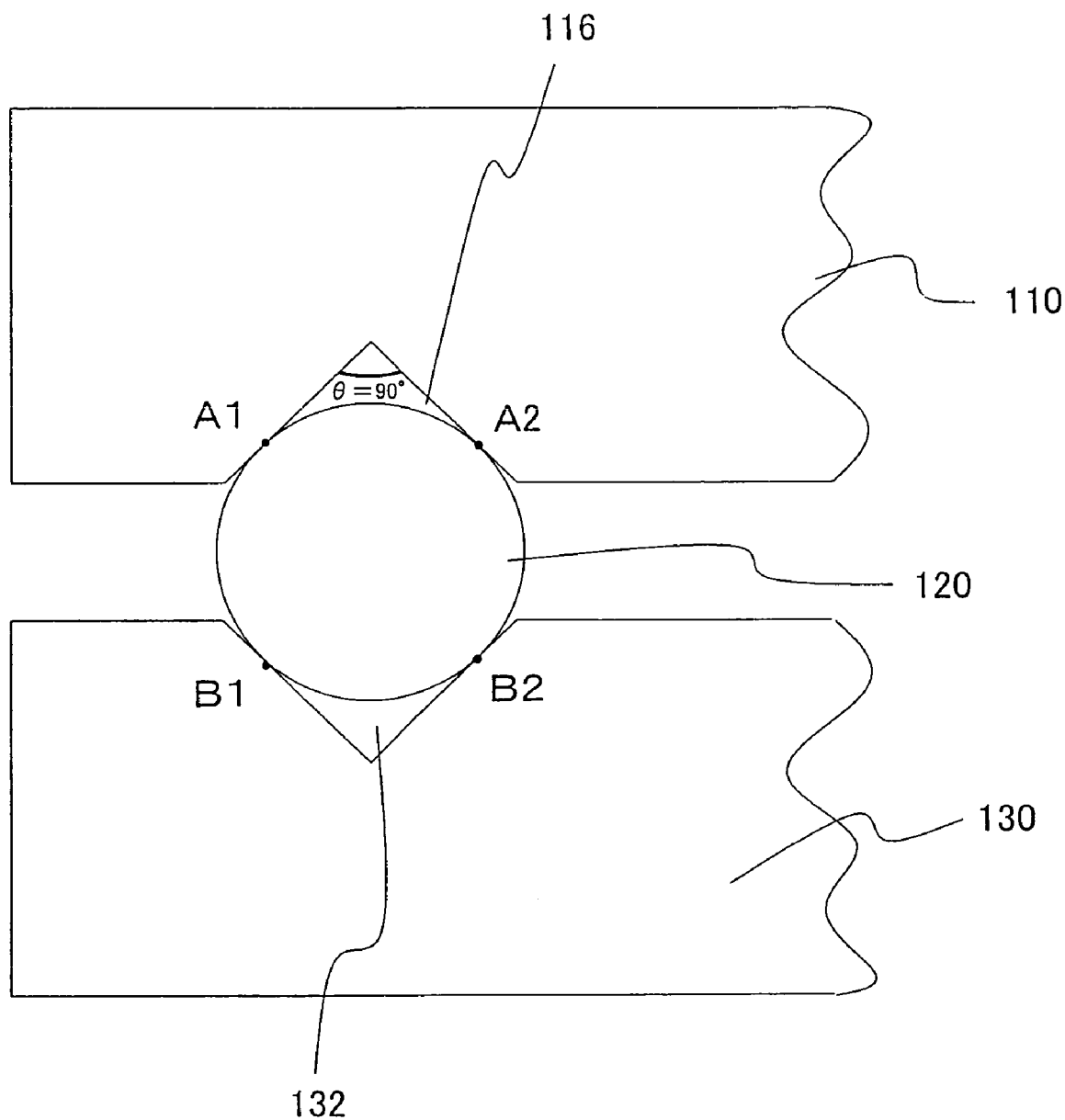
FIG. 3 is a schematic sectional view of first grooves on the optical element held by the retainer shown in FIG. 1, a support member, and second grooves on a fixing member.

The retainer 100 mounts the support members 120 on the second grooves 132 of the fixing member 130, mounts and holds the optical element 110 so that the first grooves 116 contact the support members 120. The first grooves 116 of the optical element 110 and the second grooves 132 of the fixing member 130 set, as shown in FIG. 3, an angle θ of the approximately V-shaped section to be about 90°. Thus, the first grooves 116 of the optical element 110 contact the support members 120 at two points A1 and A2, whereas the support members 120 contact the second grooves 132 of the fixing member 130 at two points B1 and B2. The support member 120 is designed to contact the first groove 116 and the second groove 132 at two points. Therefore, the retainer 100 forms such a kinematic support that the optical element 110 is supported at six points by the support member 120, which is in turn supported by the fixing member 130 at six points. A position of the optical element 110 is uniquely determined because the support member 120 is fixed relative to the fixing member due to the own weight of the optical element 110. Therefore, the retainer 100 arranges the first grooves 116 at positions apart by about 60% to 70% from the center O of the optical element 110, and minimizes the gravity deformation of the optical element 110. In addition, the kinematic support of the optical element 110 using the support members 120 that may move in the radial direction along the second grooves 132 of the fixing member 130, and reduces aberration for intended optical performance, which aberration is caused by the deformation and positional offset of the optical element 110, and would otherwise cause deterioration of imaging performance. When the optical element 110 is a transmission member, a hole may be provided in the fixing member 130 corresponding to the transmission area of the optical member 110 so as not to shield light and the fixing member 130 may be formed so that it may transmit the light. Here, FIG. 3 is a schematic sectional view of the first grooves 116 in the optical element 110, the support member 120, and the second grooves 132 in the fixing member 130 when the retainer 100 holds the optical element 110.

While the instant embodiment arranges the first grooves 116 and the second grooves 132 at a pitch of 120° around the center O of the optical element 110, an angle other than 120° may be used if the first grooves 116 correspond to the second grooves 132. Two of three angles between three grooves among three angles are preferably equal, and larger than 120°, more preferably 150°.

The first and second grooves are circumferentially arranged so that these three grooves are located at positions corresponding to each other or form the same angle around the center of the optical element or respective three grooves form the same angle, thereby enabling the retainer to fix the optical element 110.

The retainer may similarly fix the optical element when the three first grooves intersect with each other or extensions of the three first grooves intersect with each other, and the three second grooves intersect with each other or extensions of the three second grooves intersect with each other. Here, an approximately one point at which these three grooves intersect is preferably, but not limited to, the center of the optical element. The approximately one point may extend in the range of the width of the groove, and is not required to be a perfect one point.

While the support member (or first support member) 120 preferably has a spherical shape, the spherical shape is not mandatory as far as the spherical shape is formed in a region that contacts the first and second grooves.

Figure 4:
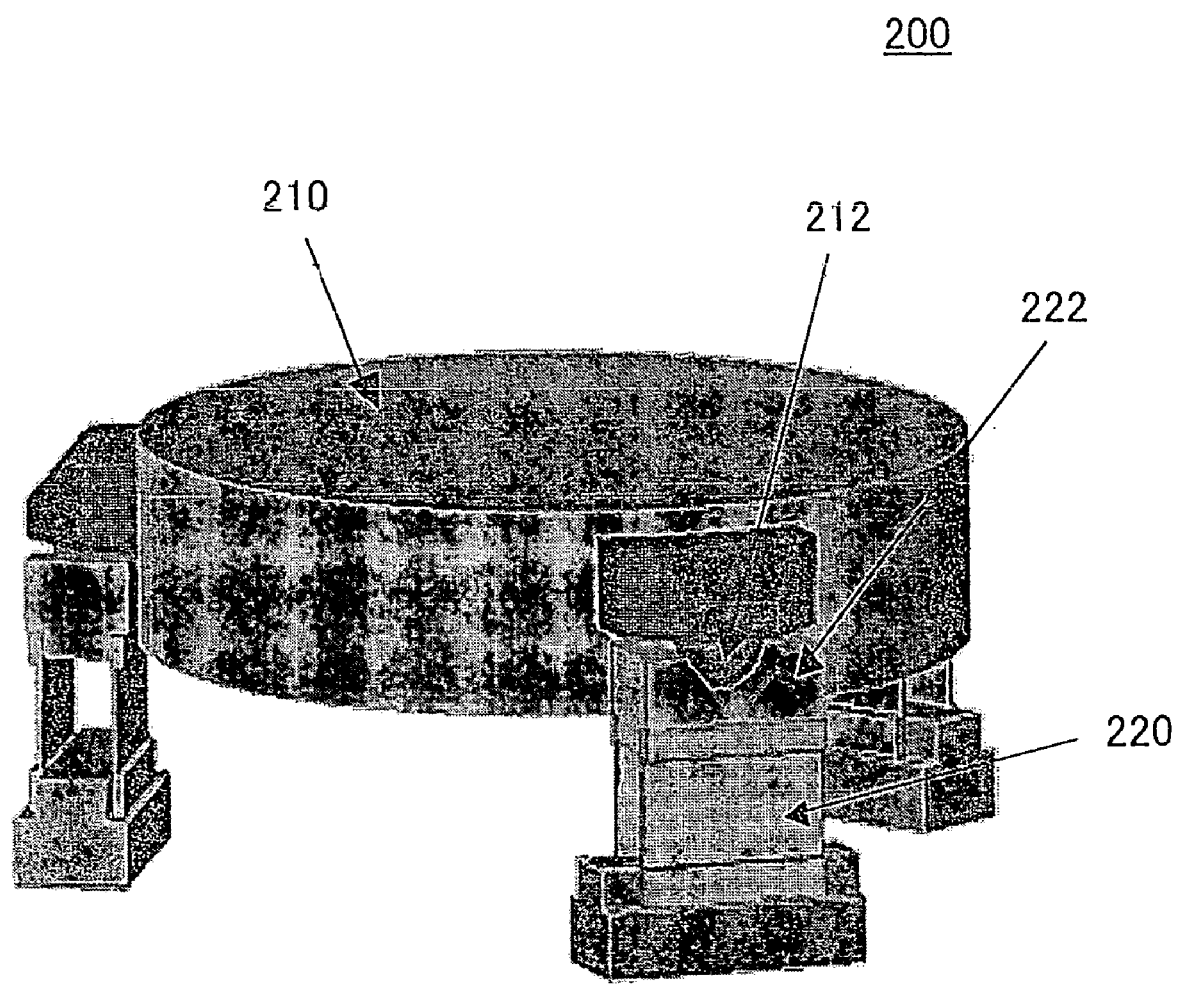
FIG. 4 is a schematic structure of a retainer of another aspect of the present invention.

A description will be given of another retainer 200 with reference to FIGS. 4 to 8. FIG. 4 is a schematic structure of the other retainer 200 as one aspect of the present invention.

The retainer 200 is applied to the projection optical system 530, and holds the optical element 210 through a holding member 220.

Figure 5:
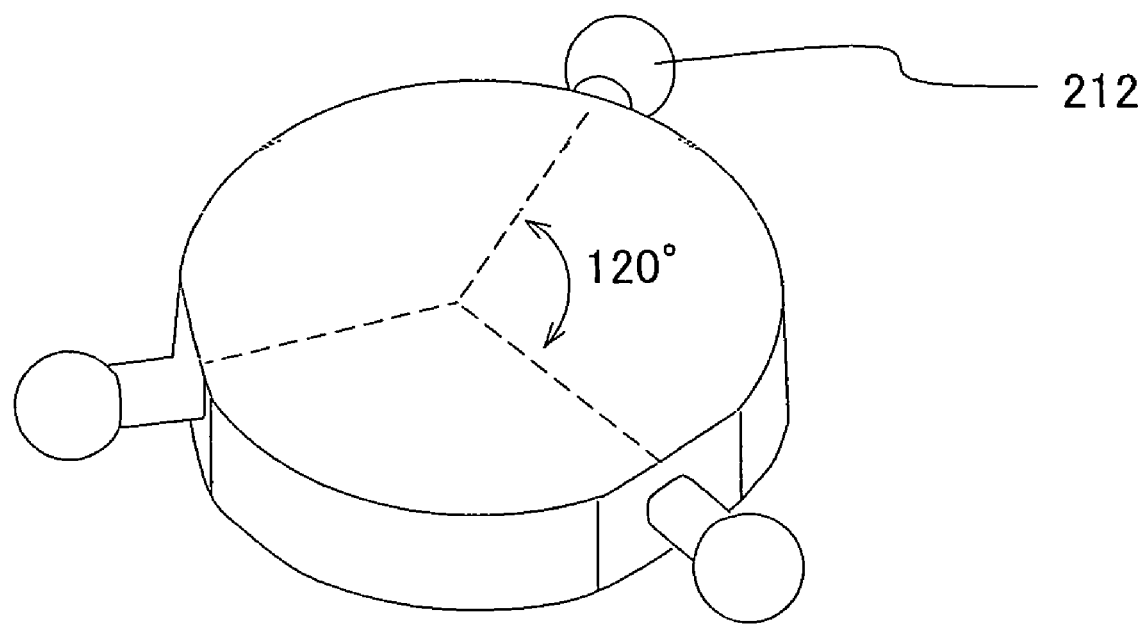
FIG. 5 is a schematic perspective view of an optical element shown in FIG. 4.

The optical element 210 is mounted on the support member 220, which will be described later, via convexes, and images light using reflections, refractions, diffractions, etc. The optical element 210 includes, for example, a lens, a parallel plate glass, a prism, a mirror, and a Fresnel zone plate, a kinoform, a binary optics, a hologram, and other diffraction optical elements. The optical element 110 has, as shown in FIG. 5, three spherical convexes 212. Here, FIG. 5 is a schematic perspective view of the optical element 210 shown in FIG. 4.

The three spherical convexes 212 are arranged at a pitch of 120°. Since the spherical convexes 212 distribute at approximately a regular interval in the circumferential direction of the optical element 210, the optical element 110 is stable on the support member 220. The instant embodiment integrates the convexes 212 with the optical element 210, and prevents the optical element 210 from changing its surface shape in coupling the optical element 210 to the convexes 212. Alternatively, the optical element 210 and the convexes 212 may be formed separately when the surface shape of the optical element 210 does not change in coupling the optical element 210 to the convexes or when a change of the surface shape is permissible.

The holding member 220 extend in a radial direction, and has V-shaped grooves 222 each having an approximately V-shaped section along a circumferential direction of the optical element 210 to mount the three spherical convexes 212 provided on a peripheral of the optical element 210, and support the optical element 210 via the grooves 222. The holding member 220 is arranged so as to correspond to the convexes 212 circumferentially provided on the optical element 210. The holding member 220 is made, for example, of an elastic material, such as a flat spring that is movable in a radial direction of the optical element 210, and serves as a rigid member in moving radius or other directions. The holding member 220 uses rigidity of the flat spring to reduce the deformation of the optical element 210 due to the frictional force generated between the convex 212 and the groove 222, in mounting the spherical convexes 212 of the optical element 210 on the sectionally V-shaped grooves 222. As the holding member 220 is movable in the radial direction, a positional offset of the optical element 210 may be prevented when the optical element 210 thermally expands isotropically from the center O.

Figure 6:
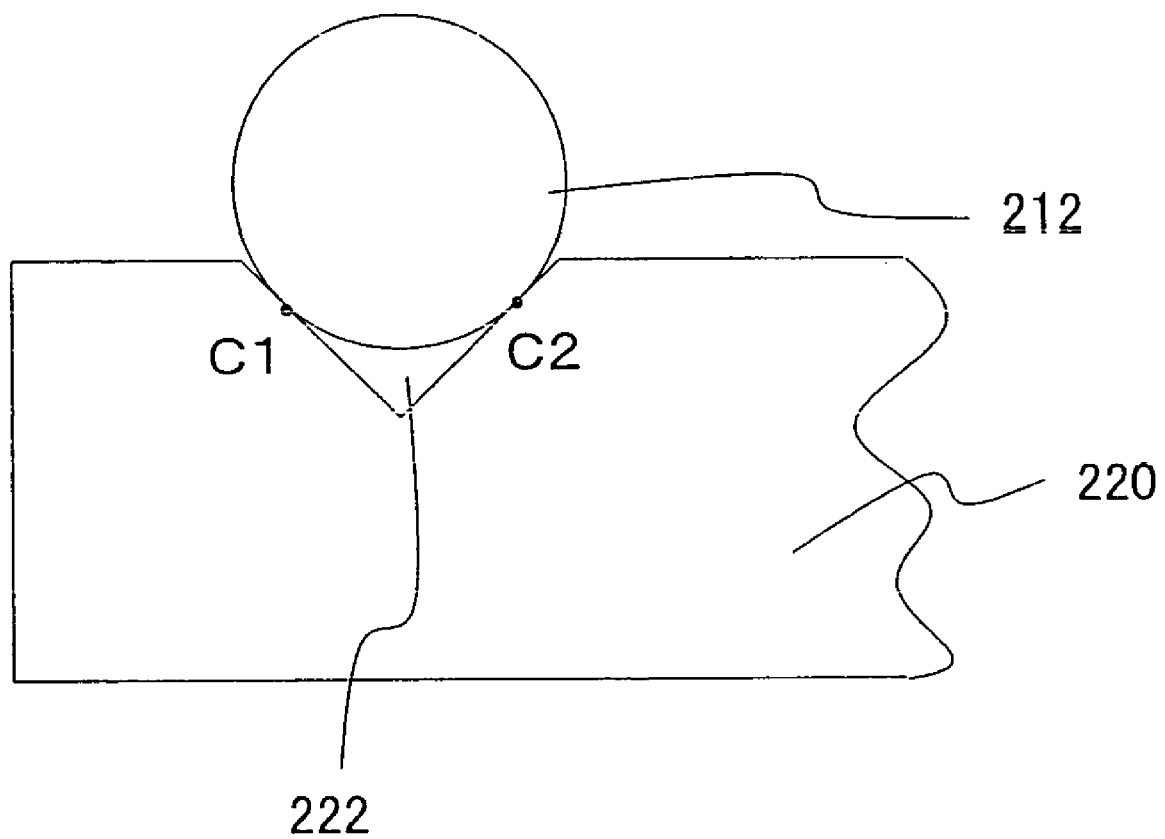
FIG. 6 is a schematic sectional view of convexes on the optical element held by the retainer shown in FIG. 4, and grooves on a holding member.

The sectionally V-shaped grooves 222 mount the spherical convexes 212, and hold the optical element 210. The grooves 222 of the holding member 220 form an angle of about 90° in the V-shaped section, as shown in FIG. 6, and contact the convexes 212 of the optical element 210 at two points C1 and C2. The convexes 212 of the optical element 210 are designed to contact the grooves 222 on the holding member 220 at two points. Therefore, the retainer 200 forms such a kinematic support that the optical element 210 is supported at six points by the holding member 220. This structure reduces aberration for desired optical performance, which aberration is caused by the deformation and positional offset of the optical element 210, and would otherwise cause deterioration of imaging performance.

Figure 7:
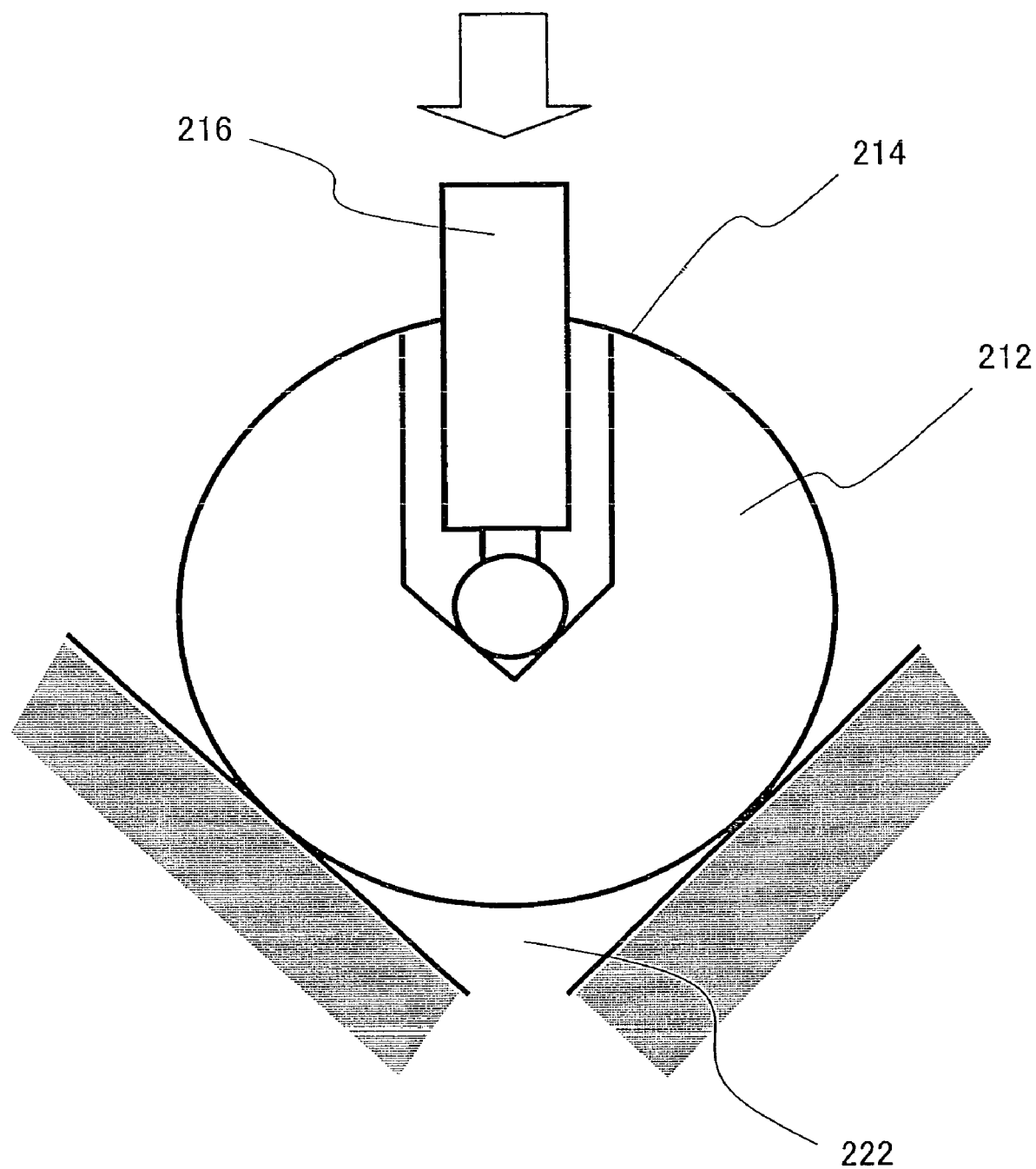
FIG. 7 is a schematic sectional view showing convexes of an optical element having a pressurizing mechanism and grooves on a holding member.

A position of the optical element 210 is uniquely determined because it is fixed relative to the holding member 220 due to the own weight of the optical element 210. When the pressure is to be applied in addition to the own weight of the optical element 210 for enhanced contact between the convexes 212 of the optical element 210 and the grooves 222 on the holding member 220, the convex 212 may be provided with the sectionally V-shaped hole 214, and a pressurization mechanism 216 may be provided as shown in FIG. 7, for pressurizing the convexes 212 through the holes 214. The pressure applied by the pressurization mechanism 216 to the convexes 212 work only inside the convexes 212, and does not deform the surface shape of the optical element 210. A spherical tip of the pressurization mechanism, the convex 212 and the sectionally V-shaped holes 214 cooperatively pressurize the convex 212. Here, FIG. 6 is a schematic sectional view of convexes 212 on the optical element 210 held by the retainer 200, and grooves 222 on a holding member 220. FIG. 7 is a schematic sectional view showing convexes 212 of the optical element 210 having the pressurizing mechanism 216 and grooves 222 on the holding member 220.

Figure 8:
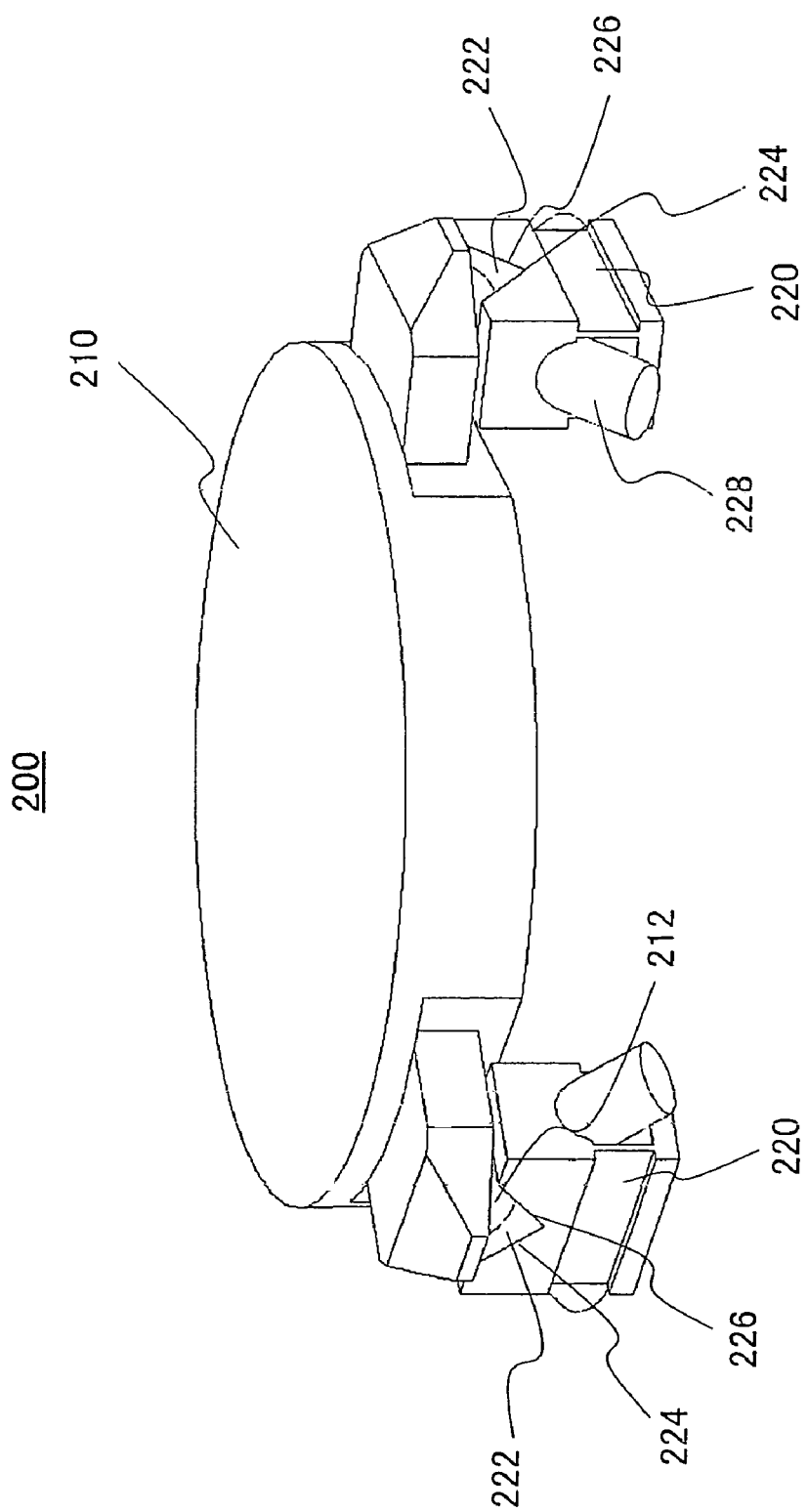
FIG. 8 is a schematic structure of a retainer that provides a holding member with a drive mechanism.

The retainer 200 may include, as shown in FIG. 8, a drive mechanism 228 for driving two support planes 224 and 226 which form the grooves 222 of the holding member 220 in a direction perpendicular to these support planes 224 and 226. The drive mechanism 228 is implemented, for example, by an actuator using a piezoelectric element, a mechanical structure using a screw lead, etc. The drive mechanism 228 acts for two support planes 224 and 226 separately. Therefore, the retainer 200 may drive six support planes, and holds the optical element 210 at six degrees of freedom including three degrees of freedom of translation, and three degrees of freedom of rotation. Here, FIG. 8 is a schematic structure of the retainer 200 that provides the holding member 220 with the drive mechanism 228.

Figure 9:
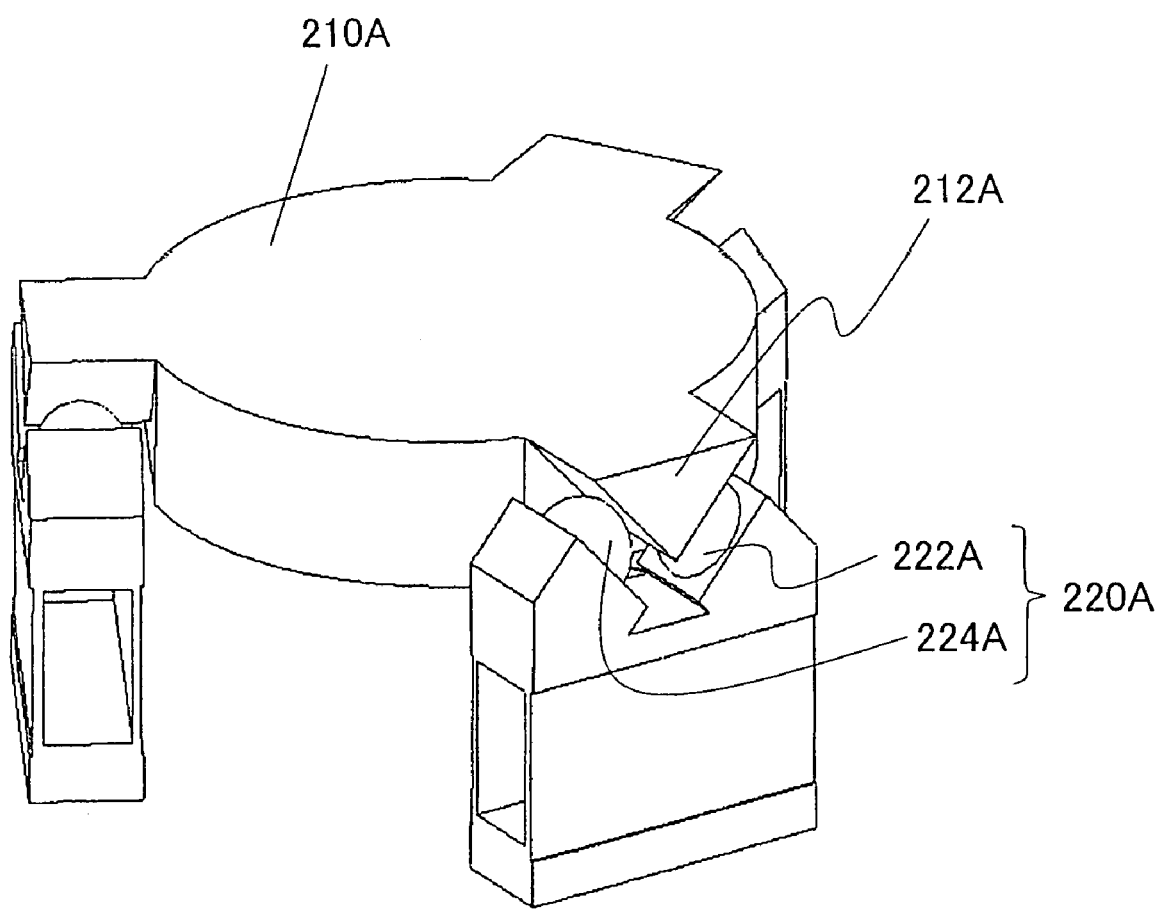
FIG. 9 is a schematic structure of a retainer as a variation of the retainer shown in FIG. 4.
Figure 10:
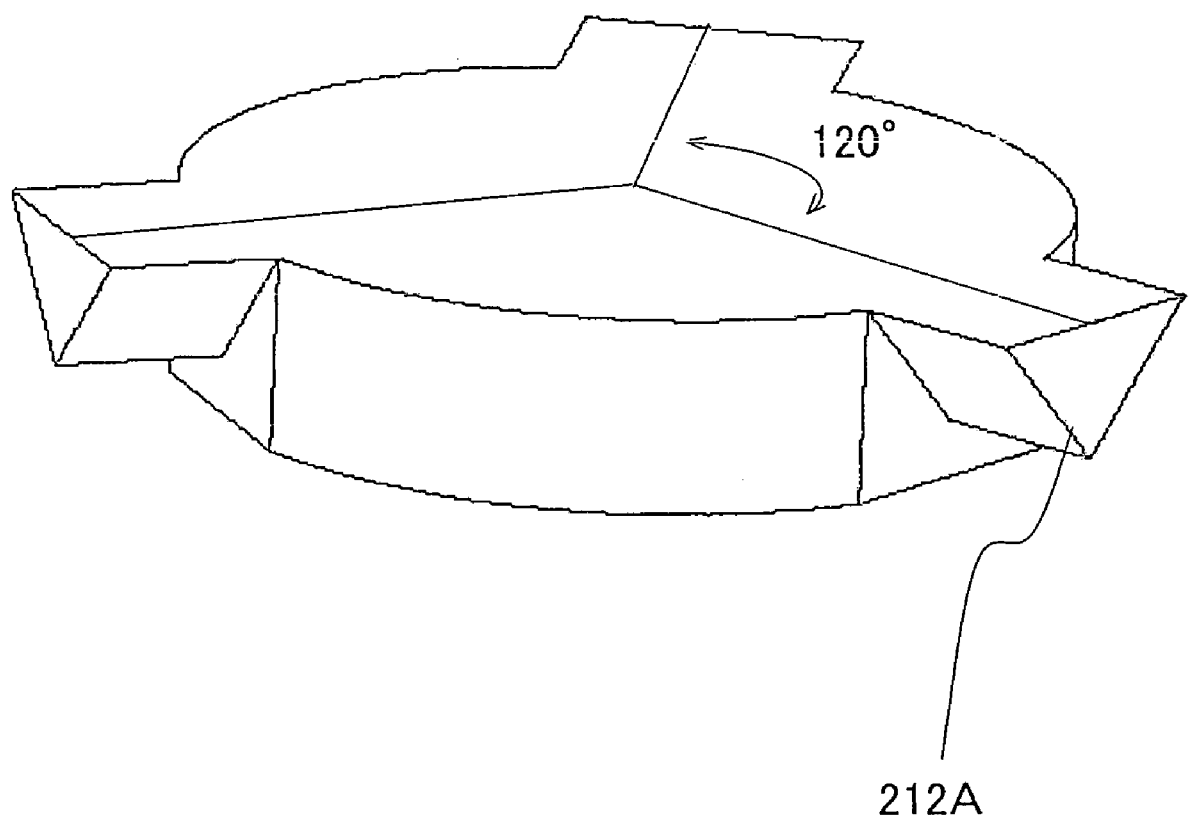
FIG. 10 is a schematic perspective view of an optical element shown in FIG. 9.
Figure 11:
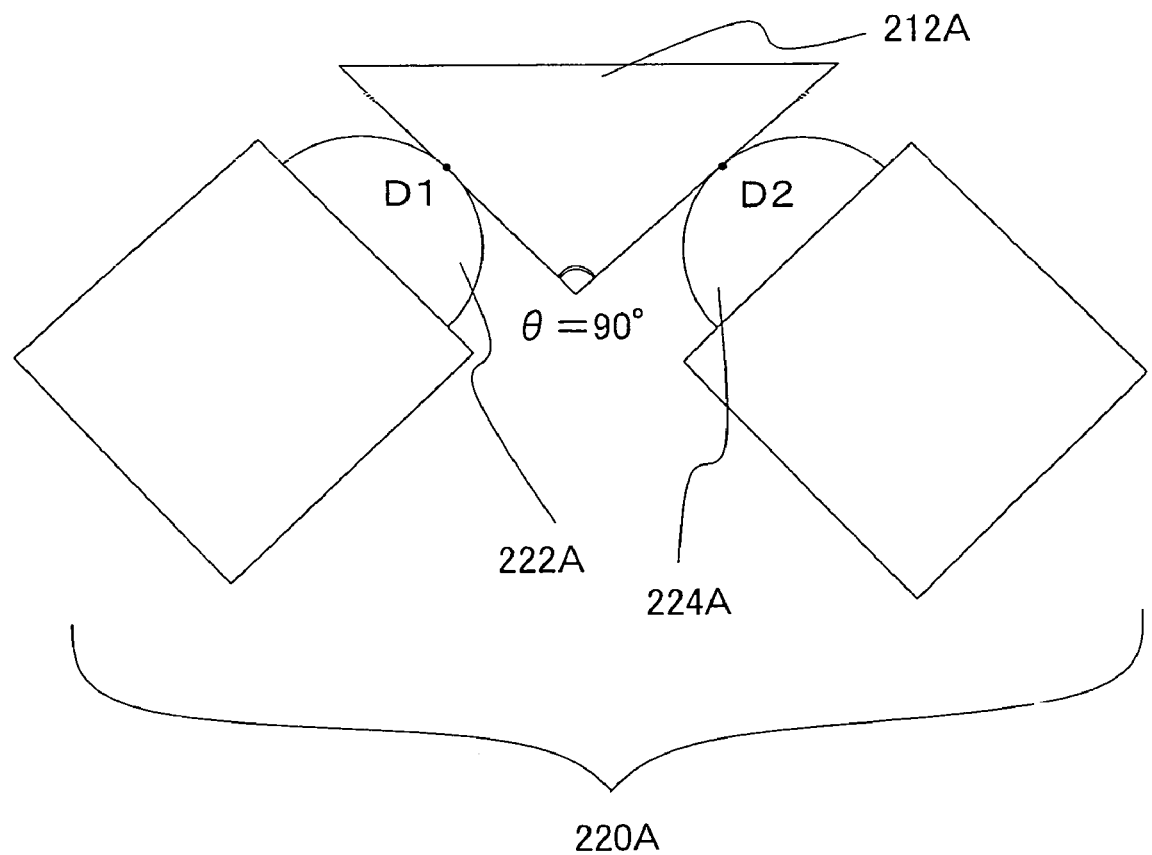
FIG. 11 is a schematic sectional view showing convexes of the optical element and two spherical parts of the holding member when the retainer shown in FIG. 9 holds the optical element.

A description will be given of a retainer 200A as a variation of the retainer 200 with reference to FIGS. 9 to 11. The retainer 200A is different from the retainer 200 in having the convexes 212A and holding member 220A of the optical element 220A. Here, FIG. 9 is a schematic structure of the retainer 200A as a variation of the retainer 200 shown in FIG. 4. The retainer 200A is applied to the projection optical system 530, and holds the optical element 210A through a holding member 220A, as best shown in FIG. 9.

The optical element 210A is mounted on the support member 220A, which will be described later, via convexes 212A, and images light using reflections, refractions, diffractions, etc. The optical element 210A has, as shown in FIG. 10, three V-shaped convexes 212A at its peripheral. Here, FIG. 10 is a schematic perspective view of the optical element 210A shown in FIG. 9. The three V-shaped convexes 212A are arranged at a pitch of 120°. Since the V-shaped convexes 212A distribute at approximately a regular interval in the circumferential direction of the optical element 210, the optical element 210A is stable on the support member 220A.

The holding member 220A has two spheres 222A and 224A that contact and sandwich three sectionally V-shaped grooves 212A provided along a circumferential direction of the optical element 210A, and supports the optical element 210A via these spheres 222A and 224A. These spheres 222A and 224A are arranged so as to correspond to the convexes 212A on the optical element 210A. The two spheres 222A and 224A are made such a member as a flat spring and a roller mechanism that is movable only in a radial direction of the optical element 210A. The holding member 220A uses these two spheres 222A and 224A to allow a radial expansion when the temperature circumstance changes and the optical element 210A thermally expands, and thus prevent a positional offset of the center O of the optical element 210A relative to the optical axis.

The two spheres 222A and 224A of the holding member 220 sandwich and mount the V-shaped convexs 212A of the optical element 210A, and hold the optical element 210A. The convex 212A of the optical element 210 set, as shown in FIG. 11, an angle θ of the V-shaped section to be about 90°. Thus, the convexes 212A of the optical element 210A and the two spheres 222A and 224A of the holding member 220 contact at two points D1 and D2. The convexes 212A of the optical element 210A are designed to contact these two spheres 222A and 224A of the holding member 220 at two points. Therefore, the retainer 200A forms such a kinematic support that the optical element 210A is supported at six points by the holding member 220A. This structure reduces aberration for desired optical performance, which aberration is caused by the deformation and positional offset of the optical element 210A, and would otherwise cause deterioration of imaging performance. Here, FIG. 11 is a schematic sectional view showing the convexes 212A of the optical element 210A and two spheres 222A and 224A of the holding member 220A when the retainer 200A holds the optical element 210A.

Figure 12:
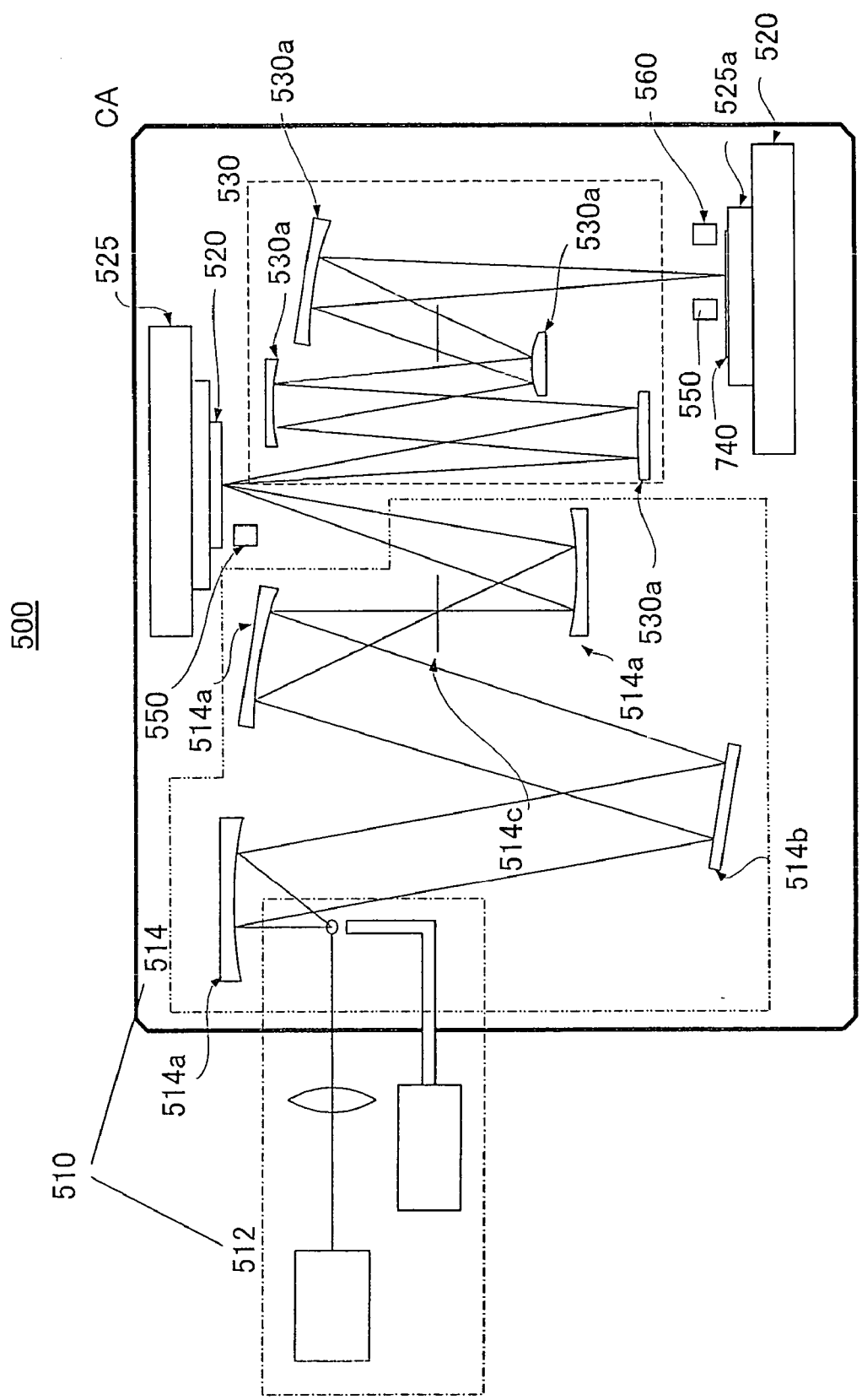
FIG. 12 is a schematic structure of the exemplary exposure apparatus according to the present invention.

A description will be given of an exemplary inventive exposure apparatus 500 with reference to FIG. 12. Here, FIG. 12 is a schematic structure of an illustrative inventive exposure apparatus 500. The inventive exposure apparatus 500 is a projection exposure apparatus that uses EUV light with a wavelength of 13.4 nm as exposure light to expose onto the plate 540 a circuit pattern created on the mask 520, e.g., in a step-and-repeat or a step-and-scan manner. Such an exposure apparatus is suitably applicable to a submicron or quarter-micron lithography process, and a description will be given below of this embodiment taking a step-and-scan exposure apparatus (which is also called "a scanner") as an example. The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

Referring to FIG. 12, the exposure apparatus 500 includes an illumination apparatus 510, a mask 520, a mask stage 525 that mounts the mask 520, a projection optical system 530, an object to be exposed 540, a wafer stage 545 that mounts the object 540, and an alignment detection mechanism 550, and a focus position detection mechanism 560.

An optical path through which EUV light passes or an entire optical system is preferably maintained in a vacuum atmosphere due to low transmittance to air of the EUV light, as shown in FIG. 12.

The illumination apparatus 510 uses arc-shaped EUV light, for example, with a wavelength of 13.4 corresponding to an arc-shaped field of the projection optical system 530 to illuminate the mask 520, and includes an EUV light source 512 and illumination optical system 514.

The EUV light source 512 employs, for example, a laser plasma light source. It generates high temperature plasma by irradiating a pulsed laser beam with high intensity onto a target material in a vacuum chamber, and uses the EUV light, for example, with a wavelength of about 13 nm, which has been emitted from the plasma. The target material may use a metallic thin film, an inert gas, a liquid-drop, etc., and the target supply unit may use a gas jet and so on. The pulse laser is usually driven with a higher repetitive frequency, such as several kHz, for increased average intensity of radiated EUV light.

The illumination optical system 514 includes a condenser mirror 514a, and an optical integrator 514b. The condenser mirror 514a serves to collect the EUV light that is isotropically irradiated from the laser plasma. The optical integrator 514b serves to uniformly illuminate the mask 520 with a predetermined NA. The illumination optical system 514 further includes an aperture 514c to limit the illumination area to an arc shape at a position conjugate with the mask 520. The inventive retainers 100, 200 and 200A (where the "retainer 100" covers the retainers 200 and 200A in the following description) are applicable to hold an optical element in the illumination optical system 514 such as the condenser mirror 514a and optical integrator 514b.

The mask 520 is a reflection-type mask that forms a circuit pattern or image to be transferred, and supported and driven by the mask stage 525. The diffracted light from the mask 520 is reflected by the projection optical system 530 and projected onto the object 540. The mask 520 and the object 540 are arranged optically conjugate with each other. The exposure apparatus 500 is a step-and-scan exposure apparatus, and projects a reduced size of the pattern on the mask 520 on the object 540 by scanning the mask 520 and the object 540.

The mask stage 525 supports the mask 520 and is connected to a moving mechanism (not shown). The mask stage 525 may use any structure known in the art. A moving mechanism (not shown) may include a linear motor etc., and drives the mask stage 525 at least in a direction X and moves the mask 520. The exposure apparatus 500 assigns the direction X to scan the mask 520 or the object 540, a direct on Y perpendicular to the direction X, and a direction Z perpendicular to the mask 520 or the object 540.

The projection optical system 530 uses plural multilayer mirrors 530a to project a reduced size of a pattern formed on the mask 520 onto the object 540. The number of mirrors 530a is about four to six. For wide exposure area with the small number of mirrors, the mask 520 and object 540 are simultaneously scanned to transfer a wide area that is an arc-shaped area or ring field apart from the optical axis by a predetermined distance. The projection optical system 530 has a NA of about 0.1 to 0.2.

The inventive retainer 100 is applicable to hold the optical element, such as the mirror 530a, in the projection optical system 530. The retainer 100 is connected to a mirror barrel of the projection optical system via a spring member. This structure may prevent the decentering of the optical element 110 relative to the mirror barrel due to a relative displacement between the mirror barrel and the optical element 110, which would otherwise caused by different coefficient of linear expansion when the temperature circumstance changes in transporting the exposure apparatus 500. The retainer 100 has the above structure. Therefore, the projection optical system 530 may reduce aberration for intended optical performance, which is caused by the deformation and positional offset of the optical element 110 which would otherwise cause deterioration of the imaging performance.

The instant embodiment uses a wafer as the object to be exposed 540, but it may include a spherical semiconductor and liquid crystal plate and a wide range of other objects to be exposed. Photoresist is applied onto the object 540. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

An object to be exposed 540 is held onto the wafer stage 545 by a wafer chuck 545*a*. The wafer stage 545 moves the object 540, for example, using a linear stage in XYZ directions. The mask 520 and the object 540 are synchronously scanned. The positions of the mask stage 525 and wafer stage 545 are monitored, for example, by a laser interferometer, and driven at a constant speed ratio.

The alignment detection mechanism 550 measures a positional relationship between the position of the mask 520 and the optical axis of the projection optical system 530, and a positional relationship between the position of the object 540 and the optical axis of the projection optical system 530, and sets positions and angles of the mask stage 525 and the wafer stage 545 so that a projected image of the mask 520 may be positioned in place on the object 540.

A focus detection optical system 560 measures a focus position in the direction Z on the object 540 surface, and control over a position and angle of the wafer stage 545 may always maintain the object 540 surface at an imaging position of the projection optical system 530 during exposure.

In exposure, the EUV light emitted from the illumination apparatus 510 illuminates the mask 520, and images a pattern formed on the mask 520 onto the object 540 surface. The instant embodiment uses an arc or ring shaped image plane, scans the mask 520 and object 540 at a speed ratio corresponding to a reduction ratio to expose the entire surface of the mask 520. Since the retainer 100 prevents the deformation and decentering of the optical element 110 and maintains the intended imaging performance, the exposure apparatus 500 may expose a fine circuit pattern with good resolution.

Figure 13:
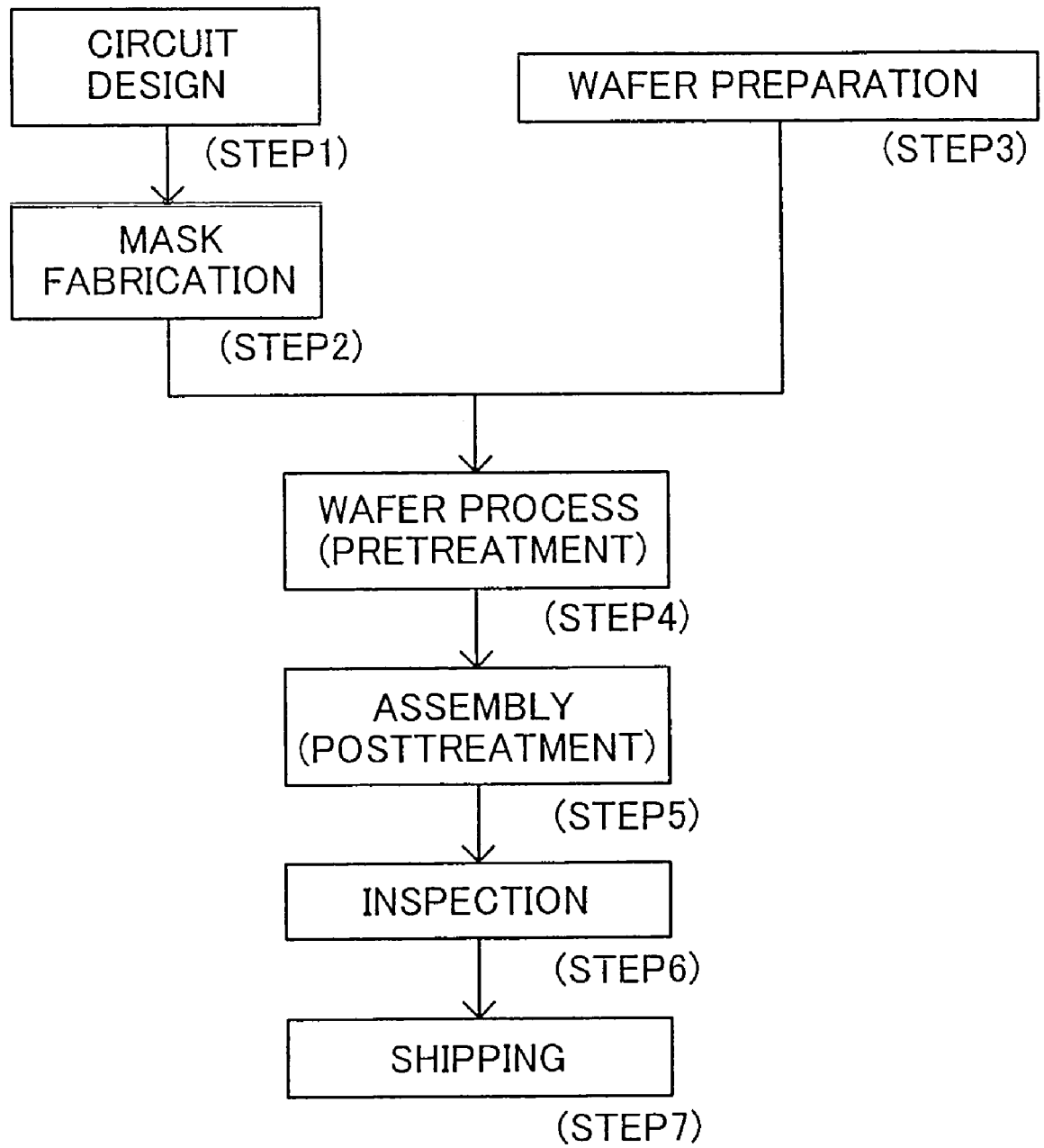
FIG. 13 is a flowchart for explaining how to fabricate devices (such as semiconductor chips such as ICs and LCDs, CCDs, and the like).
Figure 14:
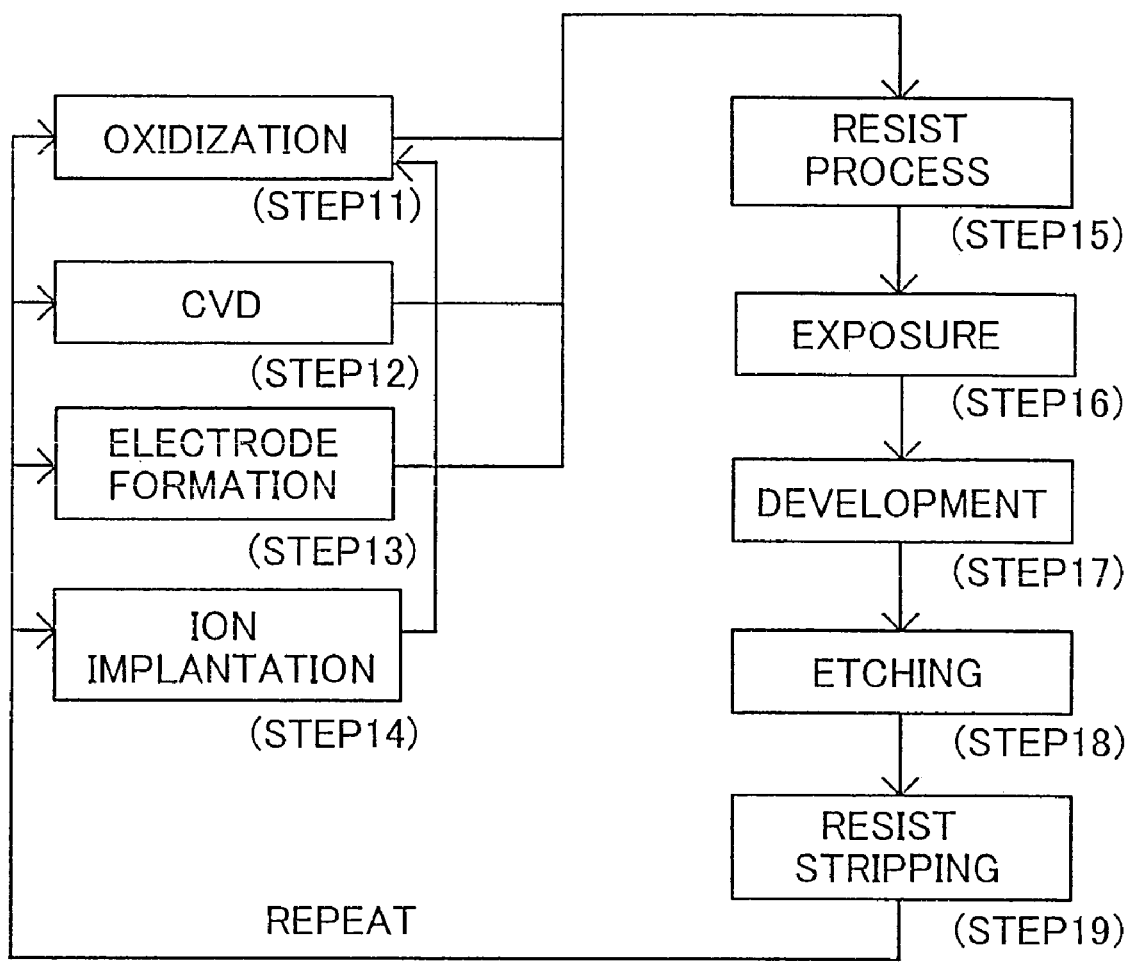
FIG. 14 is a detail flowchart of a wafer process as Step 4 shown in FIG. 13.

Referring now to FIGS. 13 and 14, a description will be given of an embodiment of a device fabricating method using the above exposure apparatus 500. FIG. 13 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 14 is a detailed flowchart of the wafer process in Step 4 in FIG. 13. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture a higher quality device than the conventional method. Thus, the device fabrication method using the exposure apparatus 500, and resultant devices constitute one aspect of the present invention.

Further, the present invention is not limited to these preferred embodiments, and various variations and modifications may be made without departing from the scope of the present invention. For example, the inventive retainer is applicable to a mask and a wafer.

INDUSTRIAL APPLICABILITY

Thus, the inventive retainer may provide desired optical performance by reducing aberration due to a deformation and a positional offset of an optical element which otherwise deteriorates the imaging performance.

The invention claimed is:

1. An optical apparatus comprising:
   an optical element having three substantially V-shaped first grooves; and
   a support configured to support said optical element kinematically, said support including three substantially spherical members configured to respectively contact said three substantially V-shaped first grooves and to support said optical element, and three substantially V-shaped second grooves configured to respectively contact said three substantially spherical members and to support said three substantially spherical members,
   wherein at least one of said substantially V-shaped first and second grooves is arranged as a spiral groove.

2. An exposure apparatus for exposing a substrate to light via a mask, said apparatus comprising an optical apparatus as defined in claim 1.

3. A method of fabricating a device, said method comprising the steps of:
   exposing a substrate to light via a mask using an exposure apparatus as defined in claim 2;
   developing the exposed substrate; and
   processing the developed substrate to fabricate the device.

* * * * *